United States Patent [19]

Krieger et al.

[11] 3,887,760

[45] June 3, 1975

[54] LAYER CIRCUIT WITH AT LEAST ONE SOLDER PLATFORM FOR THE SOLDERING ON OF SEMICONDUCTOR MODULES

[75] Inventors: Friedrich Krieger, Gilching; Christian Stein, Munich, both of Germany

[73] Assignee: Siemens Aktiengesellschaft, Berlin & Munich, Germany

[22] Filed: Feb. 4, 1974

[21] Appl. No.: 439,116

[30] Foreign Application Priority Data

Feb. 14, 1973 Germany ........................... 2307325

[52] U.S. Cl. ........... 174/68.5; 29/626; 317/101 CC; 339/17 C; 339/275 B

[51] Int. Cl. ............................................. H05k 1/18

[58] Field of Search. 174/68.5; 317/101 A, 101 CC; 29/626; 339/17 R, 17 C, 275 R, 275 B

[56] References Cited

UNITED STATES PATENTS 3,495,133 2/1970 Miller ............................ 317/101 A

*Primary Examiner*—Darrell L. Clay

*Attorney, Agent, or Firm*—Hill, Gross, Simpson, Van Santen, Steadman, Chiara & Simpson

[57] ABSTRACT

A layer circuit arranged to receive semiconductor modules by soldering, the circuit having at least one conductor path extending therealong with a solder platform at one end of the conductor path. A layer is positioned transversely across the conductor path beyond the solder platform but extends across the conductor path less than the width of the path. This layer is incapable of tinning so that it separates the solder platform at the end of the conductor path from the remainder of the path by a relatively narrow constriction.

3 Claims, 4 Drawing Figures

LAYER CIRCUIT WITH AT LEAST ONE SOLDER PLATFORM FOR THE SOLDERING ON OF SEMICONDUCTOR MODULES

BACKGROUND OF THE INVENTION

1. Field of the Invention

This invention is in the field of printed circuits which are to be joined to semiconductor modules by soldering. The invention provides a means for providing uniformly shaped solder platforms at the connection areas. It involves the use of layers of non-tinnable material bridging across adjoining conducting paths to provide a channel for the flow of solder from the solder platform.

2. Description of the Prior Art

The attachment of semiconductor modules to printed circuits by soldering in accordance with the remelting process requires uniformly shaped solder platforms of a specific area and height at those points of the conductors at which the connection points of the semiconductor modules are to appear. If these solder platforms are produced by tin plating in the usual types of baths, their height and shape are determined by the dimensions of their base areas and by the surface tension of the liquid solder. Therefore, the production of uniformly shaped solder platforms necessitates a precise definition of the bases of the platforms, the shape of the bases being preferably round or square. Since the width of the solder platform is determined by the width of the underlying conductor paths, the main problem consists in delimiting the solder platforms lying at the end of the conductor path in the direction of the remainder of the conductor path.

There have been some disclosures in the prior art by means of which the bases of the solder platforms can be precisely defined. Several such methods are described in U.S. Pat. No. 3,429,040. In general, the methods described in this patent involve surface tension to support microminiature components during joining to a supporting structure. A dielectric supporting substrate is provided with an electrically conductive pattern having a plurality of connecting areas. These connecting areas are wettable with solder while the areas immediately surrounding the connecting areas are not wettable by solder. A coating of solder is then applied to the size-limited connecting areas. A microminiature component which has solder contacts extending therefrom is then positioned on the preselected soldered connecting areas. The component contacts are gently pushed onto the solder to hold the component temporarily in place. The substrate holding the microminiature component is then heated to a temperature at which the solder melts. The molten solder is maintained in substantially a ball shape because the areas immediately adjacent to the connecting areas are not wettable by the solder. The solder connection is then allowed to cool and the microminiature component is thereby electrically connected to the conductive pattern.

The publication "IBM Technical Disclosure Bulletin" of December, 1968, Vol. 11, No. 7, page 850 describes a method in which the base of a solder platform is delimited at the end of a conductor path by providing a constriction in the conductor path.

German Laid Open application No. 2,044,494 describes connection surfaces for soldering on semiconductor modules, the surfaces being split up into two approximately square surfaces joined to one another by a narrow arm. During the soldering process, two uniformly shaped solder cups are formed on the square subsidiary surfaces, the inner cup serving as a connection surface and the outer cup as a solder reserve.

The covering of the conductor paths has the advantage that the conductor paths are conductive in their full width under the covering. There is a disadvantage, however, in that there is only a limited supply of solder for the connection points. Since each time a faulty semiconductor module is exchanged, solder is inevitably wiped away, the small size of the juxtaposed connection surfaces makes it possible to provide only a finite supply of fresh solder, and each time a module is exchanged, the quantity of solder on the solder platforms is reduced, resulting ultimately in soldering becoming difficult or impossible.

The constriction of the conductor paths has the advantage that each time a semiconductor module is exchanged, solder can flow from the conductor path through the point of constriction to the solder platform, and the height of the solder platform remains essentially the same even after several changes of semiconductor modules. On the other hand, the constriction of the conductor paths produces narrow points which promote breaks in the conductor paths, particularly in the use of the silk screen printing technique for the production of the printed circuit.

SUMMARY OF THE INVENTION

The present invention is directed to the provision of printed circuits with soldering platforms which enable the semiconductor modules to be soldered on in satisfactory fashion, while avoiding the disadvantages noted above. This objective is realized by providing an insulating substrate having a plurality of conductor paths therealong, and depositing a non-tinnable layer (a layer not wettable by solder) between two adjoining paths in closely spaced relation to the ends of the paths to thereby provide a soldering platform at such ends, the layer extending less than the full widths of the paths which it bridges to thereby provide a restricted path for solder from the soldering platform. Preferably, the non-tinnable layer defines a square base area, the lateral width of which corresponds to the width of the conductor paths. In a particularly preferred embodiment of the invention, the non-tinnable layer consists of a dispersion of glass particles in a paste which is printed on by conventional methods used in the thick layer technique.

The present invention has the advantage that by relatively simple means, without any reduction in the cross-section of the conductor paths, it is possible to achieve precisely located bases and uniformly shaped soldering platforms, and at each time the semiconductor modules are exchanged, solder is able to flow from the conductor path through the uncovered restricted path to the soldering platform.

BRIEF DESCRIPTION OF THE DRAWINGS

Other objects, features and advantages of the invention will be readily apparent from the following description of certain preferred embodiments thereof, taken in conjunction with the accompanying drawings, although variations and modifications may be effected without departing from the spirit and scope of the novel concepts of the disclosure, and in which.

DESCRIPTION OF THE PREFERRED EMBODIMENTS

Figure 1:
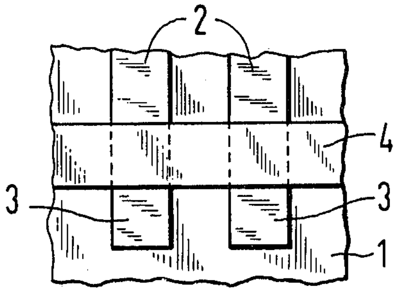
Fig. 1 PRIOR ART
FIG. 1 is a fragmentary plan view on an enlarged scale of a prior art printed circuit.

In FIG. 1, reference numeral 1 indicates a dielectric substrate 1 having conducting layers 2 formed thereon in the usual printed circuit type of arrangement. Bases 3 of the soldering platforms are defined by a layer 4 which consists of material which is not tinnable (not receptive to solder) and is arranged transversely to the conductor paths 2.

Figure 2:
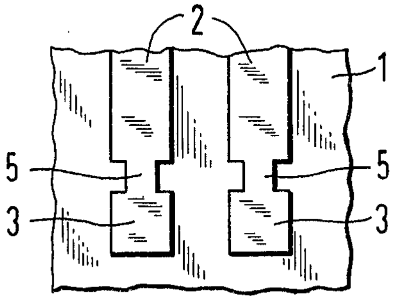
Fig. 2 PRIOR ART
FIG. 2 is a fragmentary view on an enlarged scale of another prior art structure.

In the structure shown in FIG. 2, this prior art circuit also includes a substrate 1 and conducting paths 2. Bases 3 of the soldering platform are defined by providing constrictions 5 in the conductor paths 2 short of the ends of the conductor paths as illustrated in that figure.

Figure 3:
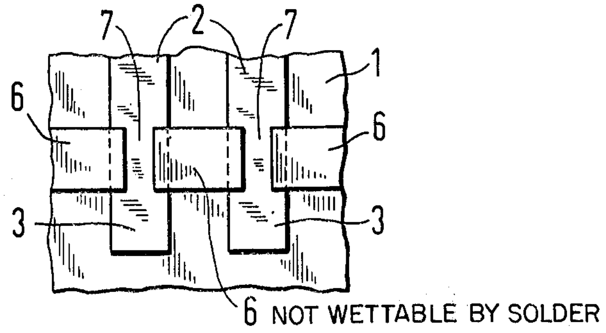
FIG. 3 is a fragmentary plan view of a structure made according to the present invention.

In the embodiment shown in FIG. 3, reference numeral 1 has been applied to a non-conductive substrate on which the conductive paths 2 are deposited. Near the ends of the conductive paths 2, there are provided soldering bases 3. These are defined by glass layers 6, leaving a relatively narrow constriction 7 between the soldering base 3 and the upper portions of the conducting paths 2. The glass layers 6 can be deposited by the usual thick film technique employing a dispersion of glass particles in a paste. As best seen in FIG. 3, the layers 6 which bridge adjoining conductor paths 2 cooperate to define the restricted path 7.

Figure 4:
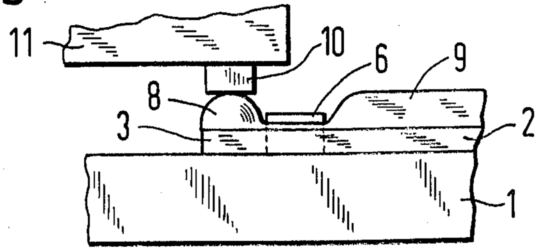
FIG. 4 is a side elevational view of the structure shown in FIG. 3.

FIG. 4 illustrates a side view of the same circuit with a semiconductor module being arranged in position, but before being heated to a soldering temperature. The conductor path 2 can be seen arranged on the substrate 1, with the end of the conductor path forming the square base 3 of the soldering platform 8. The imprinted glass layer constricts the solder layer 9 on the conductor path 2. The connection surface 10 of a semiconductor module 11 can then be positioned on the soldering platform 8 for joining thereto.

It should be evident that various modifications can be made to the described embodiments without departing from the scope of the present invention.

We claim as our invention:

1. A layer circuit having at least one conductor path extending therealong, a platform of solder on one end of said conductor path, and a layer extending across part of said conductor path beyond said solder platform, said layer being not wettable by solder, thereby separating said solder platform from the remainder of said conductor path by a narrow constriction.

2. A layer circuit according to claim 1 in which said layer defines a substantially square area on said conductor path on which said platform of solder rests.

3. A layer circuit according to claim 1 in which said layer includes glass particles.

* * * * *